United States Patent [19]

Polonio

[11] 4,125,812
[45] Nov. 14, 1978

[54] APPARATUS FOR BASELINE RESTORATION IN AN AC-COUPLED SIGNAL

[75] Inventor: John D. Polonio, Canoga Park, Calif.

[73] Assignee: Bunker Ramo Corporation, Oak Brook, Ill.

[21] Appl. No.: 807,440

[22] Filed: Jun. 17, 1977

[51] Int. Cl.² .......................... H04B 1/10; H03K 5/00
[52] U.S. Cl. ..................................... 328/162; 307/264; 328/127; 328/165; 358/34
[58] Field of Search ............... 328/127, 128, 162, 165, 328/167; 307/237, 246, 264; 358/34

[56] References Cited
U.S. PATENT DOCUMENTS 3,936,759   2/1976   Macheel ............................. 328/162

*Primary Examiner*—John Zazworsky
*Attorney, Agent, or Firm*—F. M. Arbuckle; A. Freilich

[57] ABSTRACT

Apparatus for baseline restoration in an AC-coupled signal is comprised of a differentiation circuit followed by an integration circuit to receive the signal and continually restore its DC reference. Both circuits are initially set to the DC reference, and reset after a lapse of some predetermined period based upon the worst case signal-to-noise ratio anticipated for the system. Transmission is terminated, or interrupted, before resetting. A header may be used to signal resumption of transmission to the apparatus in an asynchronous receiving mode. In a synchronous receiving mode, the transmission is simply interrupted at each time the apparatus is reset.

10 Claims, 10 Drawing Figures

APPARATUS FOR BASELINE RESTORATION IN AN AC-COUPLED SIGNAL

BACKGROUND OF THE INVENTION

This invention relates to a method and apparatus for baseline restoration in AC-coupled signals, and more particularly to a circuit for restoring the DC reference of random signals.

Whenever random codes are serially transmitted through an AC-coupled system, such as an FM radio link, there will exist at the receiving terminal a continually varying DC offset with respect to the originally transmitted signal. This random modulation of the DC reference is commonly referred to as a "galloping baseline" which, at any one instant, may be viewed as a fixed baseline offset of the signal relative to a reference.

In all practical systems, it must be assumed that the transmission link is limited in bandwidth and is fully capable of modulating the signal with some form of noise. The interpretation of a signal distorted by noise in such a transmission link is greatly aided if the true baseline of the modulated signal is known. An object of this invention is to provide an improved circuit for restoring the baseline of an AC-coupled signal.

SUMMARY OF THE INVENTION

In accordance with an important aspect of an exemplary embodiment, a differentiation circuit or network is followed by an integration circuit or network in cascade to receive an AC-coupled signal and continually restore its DC reference. Both circuits are initially set to the DC reference, and both are reset after a lapse of some predetermined period based upon the worst case signal-to-noise ratio anticipated for the information link. If used in an asynchronous receiving mode, transmission is limited to this period, after which another transmission may be initiated with a header which, upon being detected, initiates a reset. In a synchronous receiving mode, the reset is triggered periodically, and transmission is interrupted during the reset.

The novel features that are considered characteristic of this invention are set forth with particularity in the appended claims. The invention will best be understood from the following description when read in connection with the accompanying drawings.

DESCRIPTION OF PREFERRED EMBODIMENTS

As will be more fully described hereinafter, the invention is based upon the realization that, for a "slowly galloping" baseline, i.e., for a baseline that varies slowly as compared to the rate of change of the information in the signal, the slope of the AC-coupled signal is approximately equal to the slope of the signal if DC coupled. Therefore, to restore the DC reference lost in the AC coupling, what is necessary is to first detect the slope of the AC coupled signal, beginning at a known reference, and to then reconstruct the AC-coupled signal with its DC reference, also beginning at the known reference. If this is done, the AC-coupled signal will have been restored with its original DC properties. Error in this process is limited to the accuracy with which the slope of the baseline in the AC-coupled signal is assumed to be negligible, but measurable, when compared with the slope of the information signal.

Figure 1:
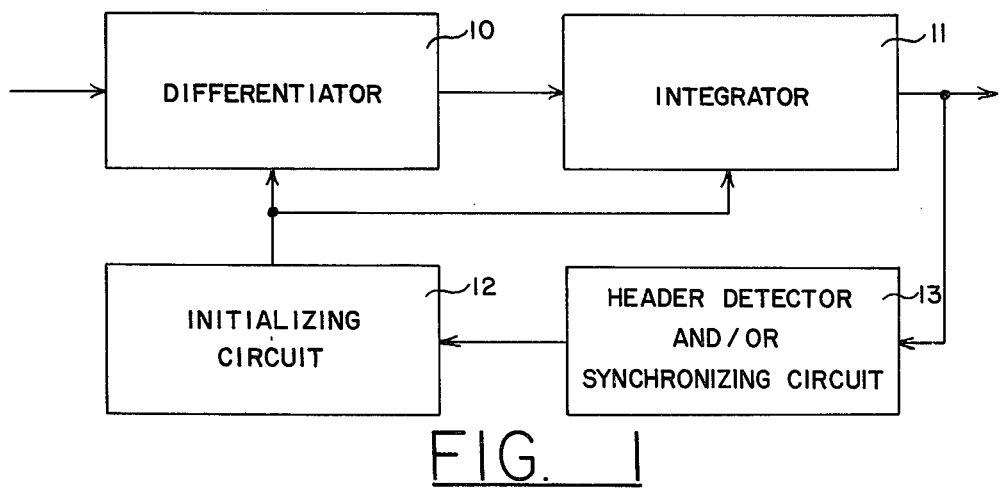
FIG. 1 is a functional block diagram of the present invention.
Figure 2:
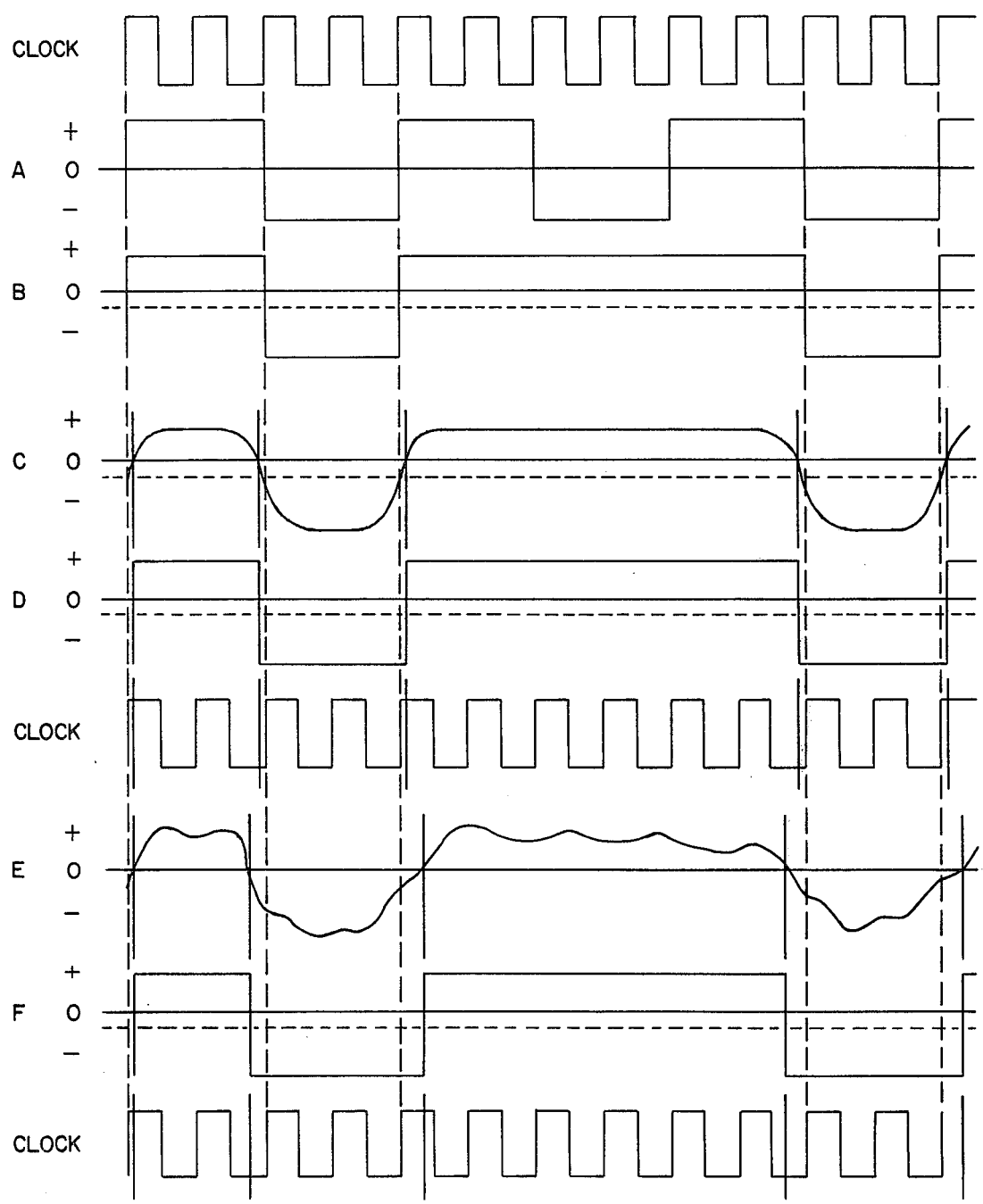
FIG. 2 is a timing diagram useful in understanding the problem which the present invention solves.

FIG. 1 shows a block diagram of a baseline restorer according to this method. Basically, there are only three essential parts to the circuit: a differentiator 10, an integrator 11, and an initializing circuit 12. Although the need for each of these parts has been outlined above, verification of the process can only be by mathematical analysis. Before presenting such an analysis, some characteristics of digital signals will first be discussed (as an exemplary aid in the understanding of baseline shifting). Refer to FIG. 2 in which waveform A shows a symmetrical bipolar digital signal centered about its true baseline. The properties of this ideal signal are such that the magnitude of the slope at the discontinuities is infinite and the slope is zero everywhere else. If accurate interpretation of this signal were desired, it would be sufficient to merely determine the polarity of the signal with respect to either its AC or DC reference (where these are identical for a symmetric signal). A very simple diode clamp circuit could be used to accomplish that, provided sufficient signal amplitude exists at the input port to fully saturate the diodes.

Useful logic signals are, however, most generally random or pseudorandom sequences of "1's" and "0's" which, as a result of AC coupling, require that their electrical baseline be shifted from the true DC reference. An example of this phenomenon is shown in waveform B (where it has been assumed that this waveform is periodic). The electrical baseline for any AC coupled signal will be that level which equalizes the areas of the waveform both above and below it. For the specific example of waveform B, the electrical baseline (0 V) lies above the true baseline indicated by a dotted line. Again, assuming that sufficient input signal amplitude exists, the diode clamp could be used to accurately interpret this logic signal.

The two previously examined logic signals would occupy an infinite amount of bandwidth. Let us now consider the same periodic signal of waveform B restricted in bandwidth to half the fundamental frequency of the clock signal (the optimal bandwidth of a transmission link for maximum signal-to-noise ratio). This signal is shown in waveform C. In this example, if the diode clamp circuit were used to reconstruct the digital signal from the bandlimited signal, a signal similar to that shown in waveform D would be produced at its output. Careful comparison of this signal with the infinite bandwidth signal of waveform B shows that the positive duty cycle has been shortened while the negative duty cycle has been increased. This phenomenon also occurs exhibiting a more severe zero crossing distortion for the case of a bandlimited signal with additive noise as shown in waveforms E and F. (The clock waveform has been repeated before and after waveforms E and F to facilitate noting the change in timing in the resulting data waveform F with respect to the original waveform B.) In an effort to preserve timing, it would be desirable to integrate the interpreted waveform over an entire bit period (one clock cycle) and then determine the bit type by comparing the positive and negative duty cycles for that period. With this form of bit determination, the zero crossing distortion must be limited to less than fifty percent of the bit period. When noise is mixed with the signal, the probability of exceeding this limit increases rapidly as the ratio of "1's" to "0's" is raised. For example, a signal which has a "1's" to "0's" ratio of 1:25 will shift its baseline by 12/13 of its peak amplitude or by about 46.2% of its peak-to-peak amplitude. If the signal is bandlimited, a shift as drastic as 46% will, even without the effects of noise, produce interbit interference during integration. Therefore, it is seen that the diode clamping type of interpreter cannot be used when large "1's" to "0's" ratios are present in a bandlimited system.

The solution to this problem might seem to be a circuit that would force a baseline to be restored precisely between the peaks of the incoming signal. This, however, is not always useful and can, in fact, produce even worse distortion than the diode clamp circuit. This method has two major sources of error. The first of these sources of error is the error between the detected peak voltages and the actual peak voltages. The second source of error is the susceptibility of this circuit to noise spikes. Spikes can often occur in a transmission link where nonlinear distortion is unavoidable. One example is an FM transmission link where the effects of FM-multipath can produce spike distortions. The peak detecting baseline restorer is actually capable of introducing a greater baseline distortion than would occur from AC coupling the same signal. Thus there exists a need for a baseline restorer which can accommodate additive noise, spikes and a large "1's" to "0's" ratio.

Figure 3:
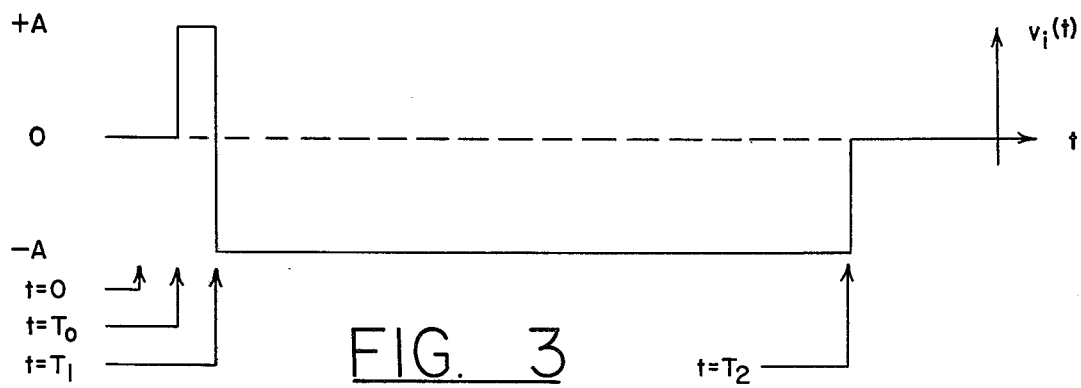
FIG. 3 illustrates an asymmetrical digital signal to be coupled by an AC coupling circuit.

A mathematical analysis of the system of FIG. 1 will now be presented. Consider the asymmetric signal of FIG. 3. Writing the time equation:

$$f_i(t) = A[U_1(t-T_0) - 2U_1(t-T_1) + U_1(t-T_2)] \quad (1)$$

where $f_i(0) = 0.0$. Performing the La Place transform:

$$f_i(t) \rightleftarrows F_i(s)$$

$$F_i(s) = (A/s)(e^{-T_0s} - 2e^{-T_1s} + e^{-T_2s}) \quad (2)$$

Figure 4:
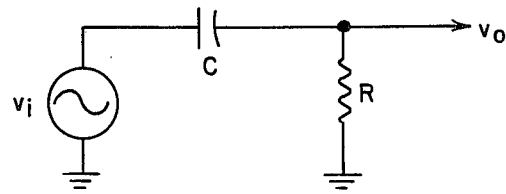
FIG. 4 illustrates a basic AC coupling circuit.

Now consider the voltage transfer function for the basic AC coupling circuit shown in FIG. 4:

$$V_o(s) = [s V_i(s) - q_o/C]/[s + 1/(RC)] \quad (3)$$

where $q_o \equiv$ the total charge on the capacitor at time $t = 0$, which is the expression for the output as a function of the input in the frequency domain with initial conditions.

Next determine the output from the AC coupling circuit when the input is the asymmetric signal. Performing the inverse La Place transform:

$$V_o(s) \rightleftarrows v_o(t)$$

$$v_o(t) = \{A[U_1(t-T_0)e^{-(t-T_0)/(RC)} - 2U_1(t-T_1)e^{-(t-T_1)/(RC)} + U_1(t-T_2)e^{-(t-T_2)/(RC)}] - (q_o/C)e^{-t/(RC)}\} \quad (4)$$

Figure 5:
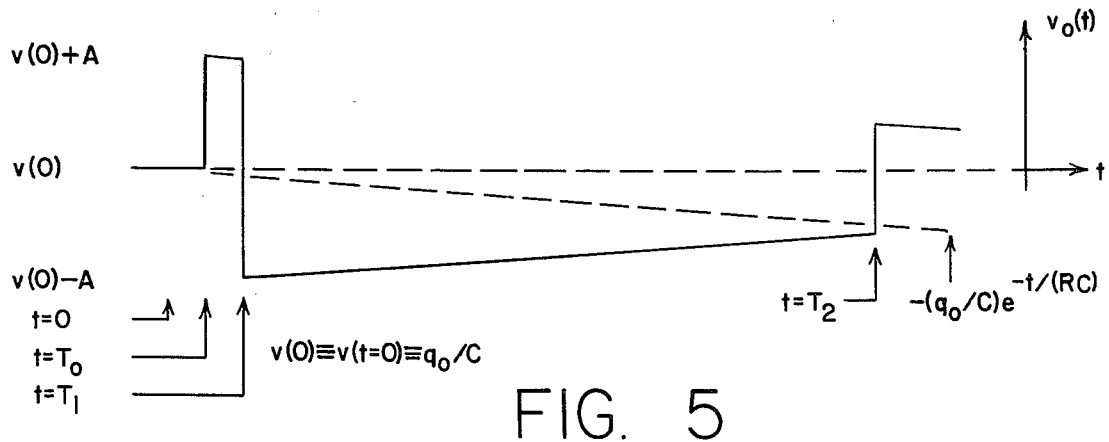
FIG. 5 illustrates the signal of FIG. 3 coupled by an AC coupling circuit.

A sketch of this waveform (using highly exaggerated and straight-lined exponential notation) is shown in FIG. 5. If it is assumed that $q_o/C$ is not zero, then examination of this waveform shows the "galloping baseline" effect brought about by the asymmetry of the waveform. The physical process which has occurred here is the repositioning of charge on the plates of the capacitor in an attempt to equalize the concentration of positive and negative charges. The time constant at which this is accomplished is RC (where the diagram of FIG. 5 represents a small value of RC).

When a transmission link increases in complexity (by, for example, the inclusion of a radio link), the information signal will be subjected to the effects of many AC coupling circuits, all of which will have a different time constant. The smallest time constant among all of the couplings will, however, determine the degree of distortion caused by the "galloping baseline." Theoretically, one can argue that if the slowest rate of change of the information signal is very much faster than the rate of change of the AC coupled baseline, then the baseline's rate of change can be viewed as nearly a constant with respect to the information signal's rate of change. If an information signal possesses these properties, then it is possible to differentiate the signal to obtain its slope without the introduction of a significant error from the slowly varying baseline term.

It can be shown mathematically that the baseline term containing $q_o/C$ is effectively removed from the signal by the differentiating circuit. However, the signal now is the derivative of the desired signal, and it is necessary to integrate to obtain the actual signal desired, as follows: Let $v_r(t) \equiv$ the asymmetric information signal after having been AC coupled, differentiated and integrated.

$$v_r(t) = A[U_1(t-T_0) - 2U_1(t-T_1) + U_1(t-T_2)] + k \quad (5)$$

where $k$ is a constant of integration. Comparison of $v_r(t)$ with the asymmetric signal $f_i(t)$ of equation (1) shows that they are dissimilar only by a constant of integration.

Thus it has been shown that any signal that has been AC coupled and suffers from a slowly varying electrical baseline reference can be restored to a known baseline within an error that is in direct relationship to the difference between the maximun rate of change of the baseline and the minimum rate of change of the information signal. The known baseline is the resulting constant of integration.

Figure 6:
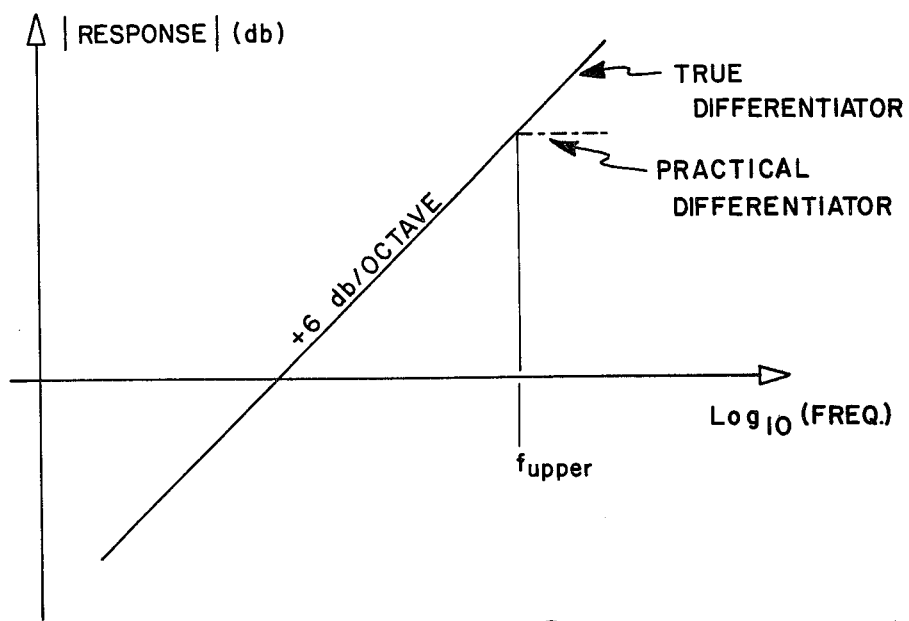
FIGS. 6 through 9 illustrate frequency response diagrams useful in understanding design criteria of the differentiator and integrator of FIG. 1.
Figure 7:
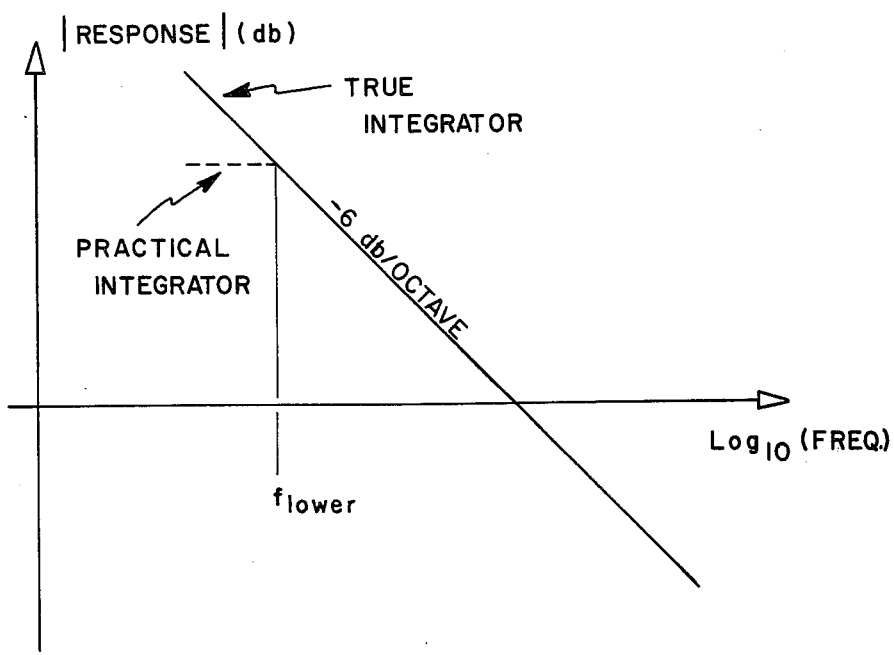
Figure 8:
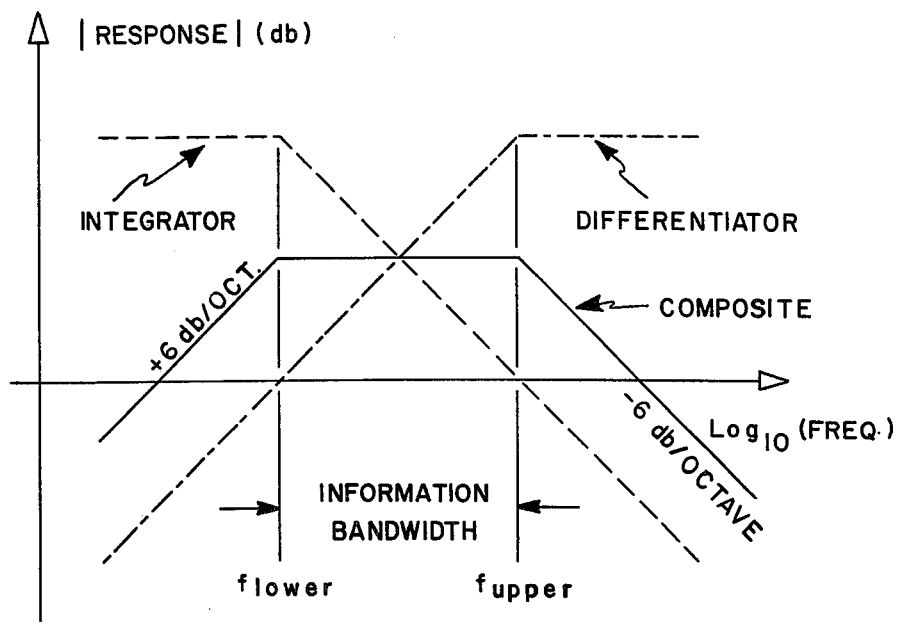
Figure 9:
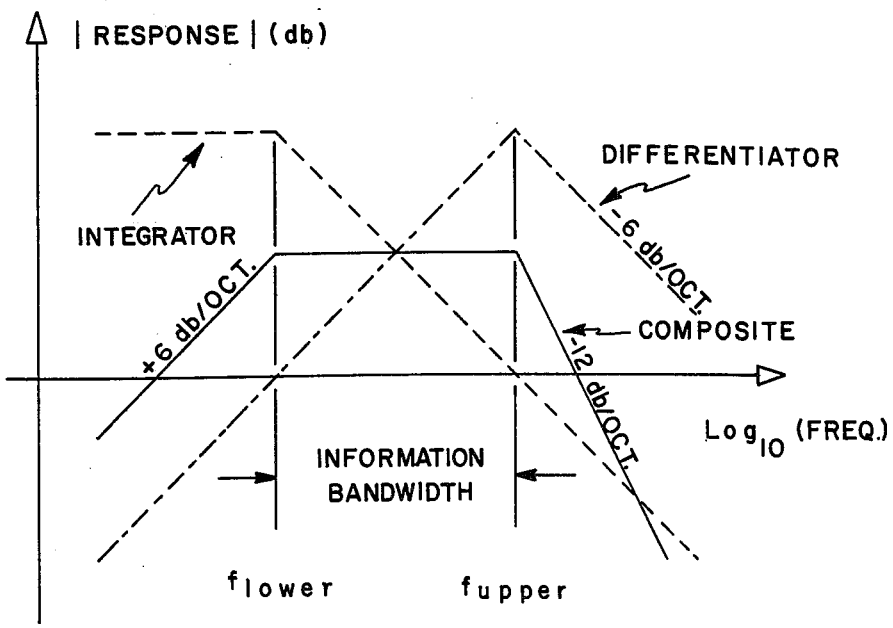

The specific designs of the transfer functions for the differentiator 10 and integrator 11 of FIG. 1 will depend largely upon the bandwidth of the information signal (waveform C of FIG. 2, for example). Th magnitude transfer function of a true differentiator is represented by a straight line with a slope of +6db per octave (+20 db/decade), as shown in FIG. 6. Similarly, the magnitude transfer function of a true integrator is represented by a straight line having a slope of −6db per octave (−20 db/decade), as shown in FIG. 7. In practice, each transfer function is magnitude-limited at some frequency as indicated by dotted lines. If a practical differentiator is combined in cascade with a practical integrator, and a gain factor is included in each, the combined transfer function will be the sum of the separate transfer functions as shown in FIG. 8 where the sum is represented by a solid line, and the respective differentiator and integrator transfer functions are represented by dotted lines. If in addition to gain, the differentiator circuit is provided with upper frequency attenuation above the bandwidth of the information signal, a composite transfer function will result as shown in FIG. 9, where the composite transfer function is shown in a solid line, and the differentiator and integrator transfer functions are shown in dotted lines. The design and implementation of an actual circuit can approximate such a composite transfer function.

Figure 10:
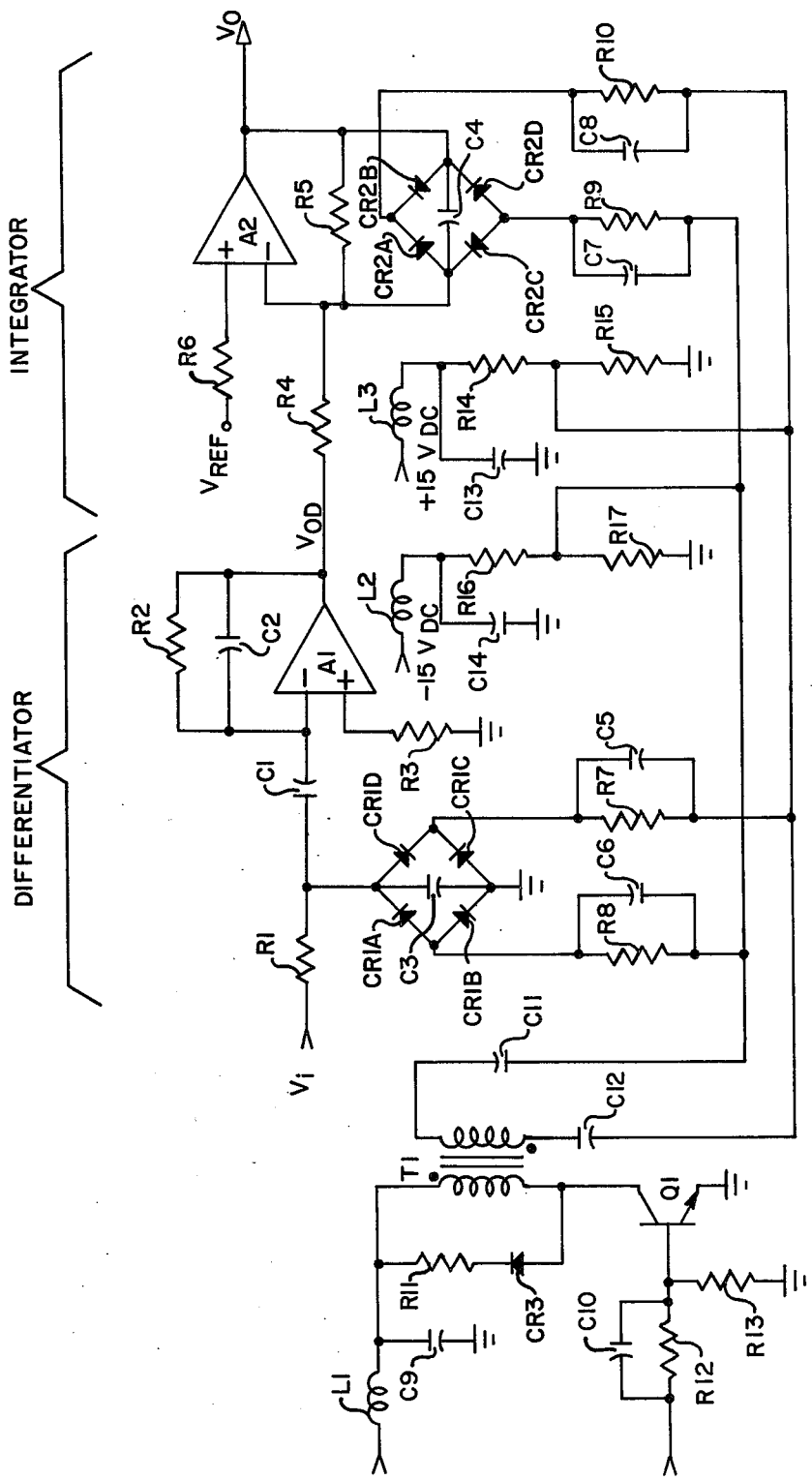
FIG. 10 illustrates an exemplary circuit design for the differentiator, integrator and initializing circuit of FIG. 1.

An exemplary circuit of the present invention is shown in FIG. 10. The differentiator circuit has the following voltage transfer function (in the frequency domain):

$$V_o/V_i(s) = -C_1/[R_1C_2(C_1+C_3)]s/([s+1/(R_2C_2)][s+1/(R_1[C_1+C_3])]) \quad (6)$$

From this equation it is easy to see that the circuit has a zero at the origin of the complex s-plane and two poles: one at $s = -1(R_2C_2)$ and a second at $s = -1/[R_1(C_1+C_3)]$. Because it is highly desirable to maintain a large signal-to-noise ratio, both poles should be chosen to occur coincident with the highest frequency of the information signal. With these zero and pole locations, all signals within the frequency band of the information signal will be differentiated and all signals above this band will be attenuated. For applications requiring a moderate bandwidth and gain, this circuit can be constructed using realistic component values.

The integrator circuit has the following voltage transfer function (in the frequency domain):

$$V_o/V_i(s) = -[1/R_4C_4]/[s+1/(R_5C_4)] \quad (7)$$

Note that this circuit approximates an integrator for frequencies at least one order of magnitude greater than the frequency location of the pole determined by $C_4$ and $R_5$. When this circuit is placed in series with the differentiator circuit as shown, all frequency components greater than those contained in the information signal are attenuated at the rate of $-12$ db/octave.

The differentiating and integrating circuits shown in FIG. 10 will approximate to a first order the processes of voltage differentiation and integration respectively. For applications involving narrow information bandwidths, it may be necessary to design circuitry which will give a more accurate approximation of these processes. When designing the circuitry, it is important to maximally attenuate all frequencies both above and below the information bandwidth. Attenuation of the lower frequencies will aid in limiting the galloping baseline effects, and the combined level of all frequency components outside the information band is directly related to the frequency at which the zeroing process must be repeated. The main disadvantage of using any first order approximation circuitry is seen when the differentiator is placed in series with the integrator. Ideally, the transfer response for this topology across the information bandwidth should be a maximally flat amplitude response and a linear phase response.

Referring now to the initializing circuit 12, it is assumed that the baseline restoration circuit is to be operated in a system where a significant amount of noise exists in the absence of the information signal. One example of this type of signal source is the output of an FM receiver that employs a limiter in its demodulation circuitry. Noise of this form can contain frequency components outside the band of interest and its presence can cause an error voltage to accumulate across the integrating capacitor $C_4$. This change in the integrator's reference voltage would force the superposition of a constant voltage level (random in both sign and magnitude) onto the processed information signal. The initializing circuit, however, is designed to reset the integrator's reference.

Initialization is accomplished by first ensuring that the voltages across $C_1$, $C_3$ and $C_4$ are all simultaneously set to zero (thereby establishing the integrator's reference as zero) and secondly by limiting the rate of change of the voltage across $C_3$, immediately after zeroing, to remain within the bandwidth of the differentiator and integrator. This rate of change of voltage is dependent upon all three components $R_1$, $C_1$ and $C_3$ and has the time constant $R_1(C_1+C_3)$ which, of course, is directly related to the bandwidth of the differentiator. To zero $C_1$, $C_3$ and $C_4$, a pulse must be passed through the diodes CR1A to CR1D and CR2A to CR2D of sufficient amplitude to cause them to saturate and of sufficient duration to allow the discharge of the capacitors through the effective impedance of the diodes. To maintain a reverse biased condition on the diodes at all other times, the zeroing pulse is AC coupled through the pulse transformer $T_1$ and capacitors $C_{11}$ and $C_{12}$.

The zeroing of the restoration circuit must occur whenever the integrating capacitor accumulates a charge level sufficiently large to degrade the reliability of the bit interpreting process discussed earlier. This type of shift in the baseline is a function of the amplitude of the noise frequency components which lie outside the information bandwidth. The periodicity of the zeroing processing must be determined analytically to satisfy a given error probability. Furthermore, this calculation is strongly dependent upon the degree of filtering prior to the restoration circuitry and the noise figure of the entire transmission link. It is also extremely important that the zeroing process occurs when the value of the transmitted signal is fixed, for the duration of the entire zeroing process, at the reference voltage of the restoration circuitry. Because the reference voltage must be adjusted by the gain of the system, this reference is most logically chosen to be zero. From these restrictions it is now seen that once a point in common is established simultaneously by the transmitter and receiver, it is only necessary to track the deviation from this reference to reconstruct the original signal.

In operation, an AC-coupled signal $V_i$ is differentiated as a function of time, starting from a predetermined initial voltage of zero, by an RC network comprised primarily of resistor $R_1$ and capacitor $C_1$. This process limits the galloping baseline effects. The output $V_{od}$ of amplifier $A_1$ is then integrated as a function of time, starting from a predetermined initial voltage $V_{REF}$, by the feedback network $R_5$ and $C_4$ of the operational amplifier $A_2$ to obtain an output voltage, $V_o$, that is the desired AC-coupled signal with its baseline restored. The baseline will be restored relative to the baseline reference voltage, $V_{REF}$, applied to the operational amplifier $A_2$ through a resistor $R_6$. In the usual case, that reference voltage is conveniently set to zero by connecting the resistor $R_6$ to circuit ground. To initialize the differentiator and integrator, a positive pulse applied to the base of transistor $Q_1$ is coupled by the pulse transformer $T_1$ to the switch comprised of diodes CR1A to CR1D and to the switch comprised of diodes CR2A to CR1D to discharge the capacitor $C_3$ to zero (circuit ground) and the capacitor $C_4$ also to zero (virtual ground).

The advantages of the baseline restoration circuit presented here are its immunity to noise spiking, narrow bandwidths and large "1's" to "0's" ratios. To obtain these features it was necessary to require a well defined zeroing process which must be repeated periodically. For many applications this restriction is easily accommodated by the addition of a suitable preamble to the transmitted message. This method of implementation is recommended for communication links with relatively low transmission duty cycles. As the duty cycle increases, synchronous methods of determining zero periods become more attractive, allowing the initializing process to occur within a few bit periods. Thus, in some applications, the receiver may be conveniently synchronized with the transmitter. In such a synchronous system, a transmission may be commenced with a header, that is detected by a detector circuit 13, which includes a circuit to synchronize periodic pulsing of the initializing circuit in synchronism with interruptions in the transmission. In other applications, where the receiver is not synchronized with the transmitter, the functional block 13 would include only a header detector to pulse the initializing circuit at the beginning of a transmission. Each transmission must then be limited at the transmitter to the maximum period that the baseline restoration circuit may be permitted to operate without being reset. If there is additional information to be transmitted, it is divided into blocks and transmitted with a header for each block.

Although particular embodiments of the invention have been described and illustrated herein, it is recognized that modifications and equivalents may readily occur to those skilled in the art and consequently it is intended that the claims be interpreted to cover such modifications and equivalents.

The embodiments of the invention in which an exclusive property or privilege is claimed are defined as follows:

1. A method for baseline restoration in an AC-coupled signal comprising the steps of differentiating said AC coupled signal as a function of time, starting from a predetermined initital level to obtain a differentiated signal, and integrating said differentiated signal as a function of time starting from said predetermined initial level to obtain said AC-coupled signal with its baseline restored.

2. A method as defined in claim 1 wherein separate means are employed for differentiating and integrating, and including the step of presetting said predetermined initial level across said separate means at the commencement of said signal.

3. A method as defined in claim 2 wherein commencement of said signal is indicated by a header, and said method includes the step of detecting said header and in response thereto, presetting said predetermined initial level across said separate means or presetting said predetermined conditions in said networks containing multiple components.

4. A method as defined in claim 3 wherein said signal is limited at its source to predetermined periods of transmission, and each period of transmission is commenced with a header, whereby initialization of said differentiating and integrating means occurs at the commencement of each separate period of signal transmission.

5. A method as defined in claim 3 wherein said signal is periodically interrupted at its source to separate said signal into separate periods, and said method includes the step of initializing said differentiating and integrating means at the commencement of each of said separate transmission periods.

6. Apparatus for baseline restoration in an AC-coupled signal comprised of
   a differentiator circuit having an input terminal adapted to receive said signal and an output terminal,
   an integrator circuit having an input terminal and an output terminal, said integrator input terminal being connected to said differentiator output terminal, and
   a means for initializing said differentiator circuit and said integrator circuit at the commencement of said signal.

7. Apparatus as defined in claim 6 wherein said signal includes a header at the commencement thereof, and said initializing means includes electronic switches and means for detecting said header and, in response to detection of said header, applying an initializing pulse to said electronic switches for initialization of said differentiator and integrator circuits.

8. Apparatus as defined in claim 7 wherein said signal is periodically interrupted at intervals following said header, and said initializing means includes synchronizing means for applying an initializing pulse to said electronic switches during said intervals for initialization of said differentiator and integrator circuits.

9. Apparatus as defined in claim 6 wherein said integrator circuit has the following voltage transfer function:

$$V_o/V_i(s) = -[1/(R_4C_4)]/[s+1/(R_5C_4)]$$

where $R_5$ and $C_4$ are a resistor and a capacitor, respectively connected in parallel in the negative feedback path of an operational amplifier between the output terminal and an inverting input terminal thereof, and $R_4$ is a resistor for coupling the output terminal of said differentiator circuit to said inverting input terminal of said integrator operational amplifier, and $V_o$ and $V_i$ are respective output and input signals of said integrator operational amplifier.

10. Apparatus as defined in claim 9 wherein said differentiator circuit has the following voltage transfer function:

$$V_o/V_i(s) = -C_1[R_1C_2(C_1+C_3)]s/[s+1/(R_2C_2)][s+1/(R_1[C_1+C_3])]$$

where $R_1$ is a coupling resistor and $C_3$ is an integrating capacitor and said resistor $R_1$ is connected to couple said differentiator input terminal to said capacitor $C_3$ connected to a source of reference potential; $C_1$, is a differentiating capacitor coupling said integrating capacitor to an inverting input terminal of an operational amplifier, and $R_2$ and $C_2$ are a resistor and a capacitor connected in parallel in the negative feedback path of said differentiator operational amplifier.

* * * * *